(12) United States Patent
Brown et al.

(10) Patent No.: US 11,101,158 B1
(45) Date of Patent: Aug. 24, 2021

(54) WAFER-SCALE MEMBRANE RELEASE LAMINATES, DEVICES AND PROCESSES

(71) Applicant: United States of America as represented by the Administrator of NASA, Washington, DC (US)

(72) Inventors: Ari D. Brown, Ellicott City, MD (US); Joseph Oxborrow, Glen Burnie, MD (US); Vilem Mikula, Washington, DC (US); Kevin L. Denis, Crofton, MD (US); Timothy M. Miller, Silver Spring, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 24 days.

(21) Appl. No.: 16/058,192

(22) Filed: Aug. 8, 2018

(51) Int. Cl.
*H01L 21/683* (2006.01)
*H01L 21/027* (2006.01)
*H01L 37/00* (2006.01)

(52) U.S. Cl.
CPC ...... *H01L 21/6835* (2013.01); *H01L 21/0273* (2013.01); *H01L 37/00* (2013.01); *H01L 2221/6834* (2013.01); *H01L 2221/68381* (2013.01)

(58) Field of Classification Search
None
See application file for complete search history.

(56) References Cited

U.S. PATENT DOCUMENTS

| | | | | |
|---|---|---|---|---|
| 5,379,712 | A * | 1/1995 | Armini | C30B 9/00 117/75 |
| 8,852,391 | B2 * | 10/2014 | McCutcheon | H01L 21/187 156/714 |
| 2005/0029224 | A1 * | 2/2005 | Aspar | H01L 21/6835 216/33 |

* cited by examiner

*Primary Examiner* — Hung K Vu
(74) *Attorney, Agent, or Firm* — Christopher O. Edwards; Bryan A. Geurts; Helen M. Gaius

(57) ABSTRACT

The disclosed subject matter relates to techniques, laminates and devices used to fabricate thin dielectric or semiconductor membranes including a handling substrate including a photoresist material on a first surface thereof, a semiconductor wafer having a circuit pattern on a first surface and a second surface to be processed and a temporary adhesive layer temporarily bonding the first surface of the semiconductor wafer to the first surface of the handling substrate including the photoresist material.

8 Claims, 5 Drawing Sheets

WAFER-SCALE MEMBRANE RELEASE LAMINATES, DEVICES AND PROCESSES

FIELD

This disclosure relates to a device and process for fabricating thin dielectric membranes, in which a semiconductor-on-insulator wafer is used.

BACKGROUND

Many semiconductor devices are fabricated using thin semiconductor membranes. Fabricating such devices can be challenging because of the manufacturing issues confronted by utilizing such thin membranes.

Bolometers or bolometric detectors detect an increase in temperature caused by IR absorption of an object as a change in resistance. If an object is made of a semiconductor, the resistance decreases in response to the temperature increase. Dielectric materials such as silicon and silicon nitride can be used in the fabrication of bolometers.

Ultrasensitive bolometric detectors typically consist of a detector or sensor element fabricated on a thin membrane, which is usually comprised of a dielectric material such as silicon or silicon nitride. The detector element is thermally isolated from the outside world with one or more structures which can be comprised of the same material(s) as the membrane. As the signal to noise requirements for the detectors become more stringent, the form factor of the thermal isolation structure, which is defined as the length divided by the cross-sectional area will usually need to become larger. However, there is often a need for the filling fraction of the detector elements to be high, which places limitations on the length of the thermal isolation structure. As the cross-sectional area of the thermal isolation structures decreases, so does their mechanical strength.

Fabricating ultrathin (~1 micron thick) membranes, such as bolometric detectors with thermal isolation structures as well as other semiconductor and silicon on insulator (SOI) devices can include patterning and etching the thermal isolation structures on the front side of a silicon on insulator wafer, bonding the wafer to a handling substrate using a temporary adhesive, etching the wafer from the back to define the membrane regions, dissolving adhesive with an organic solvent, and removing the parts from the solvent.

FIG. 1 is a cross-section including a micromachined device 100 having a silicon device layer/membrane 102, a buried oxide layer 104 and silicon frame region 106. FIG. 1 also includes a backing substrate 108 and a temporary bonding layer 110, the latter being a layer of temporary adhesive. Upon dissolution of the temporary bonding layer 110 in a solvent, surface tension can cause the silicon device layer/membrane 102 to adhere to the backing substrate 108. Separation of the micromachined device 100 from the backing substrate can result in membrane breakage if the resulting capillary pressure exceeds a critical amount.

The disadvantages of such a process include that as the membrane material becomes thinner and, consequently, less mechanically robust and the act of removing parts containing the membranes from solvents results in their destruction. This is because the surface tension of the solvent acts to pull the membranes towards the backing substrate. Removal of the membrane-containing part, can thus cause the membranes to shear and break.

SUMMARY

In one embodiment, a semiconductor processing laminate construct is provided. The semiconductor processing laminate construct includes a handling substrate including a photoresist material on a first surface thereof, a semiconductor wafer having a circuit pattern on a first surface and a second surface to be processed and a temporary adhesive layer temporarily bonding the first surface of the semiconductor wafer to the first surface of the handling substrate including the photoresist material.

In another embodiment, a semiconductor processing laminate construct is provided. The semiconductor processing laminate construct includes a handling substrate including a photoresist material on a first surface thereof, a semiconductor on insulator wafer device and a temporary adhesive layer. The semiconductor on insulator wafer device includes a semiconductor wafer having a circuit pattern on a first surface and a second surface and insulator material to be processed on the second surface of the semiconductor wafer. The temporary adhesive layer temporarily bonds the first surface of the semiconductor wafer to the first surface of the handling substrate.

In another embodiment, a method of processing a semiconductor on insulator wafer device on a substrate is provided. The method includes providing a handling substrate including a photoresist material on a first surface thereof, providing a semiconductor on insulator wafer device having a circuit pattern on a first surface and a second surface to be processed and affixing the first surface of the semiconductor wafer to the first surface of the handling substrate including the photoresist material substrate using a temporary adhesive.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
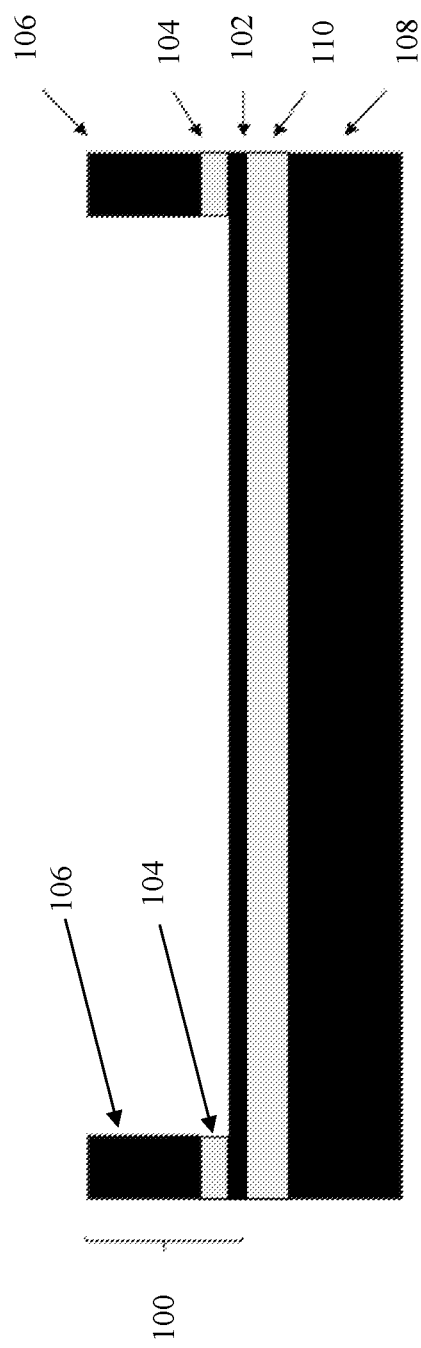
FIG. 1 is a schematic illustration of a cross section of a prior art device.

Embodiments of the present disclosure include techniques used to fabricate thin dielectric or semiconductor membranes, such as those used as substrates for ultrasensitive detectors as well as the devices themselves. These dielectric membranes may be perforated and include thermal isolation structures such as shown in the "Membrane Layout" illustrated in FIG. 6.

In general, the present disclosure includes methods, laminates and devices that include a handling substrate with section(s) of a photoresist material thereon such that the side of the handling substrate with the section(s) of photoresist material also includes sections of the handling substrate surface exposed on those substrate sections without photoresist material. Preferably, the thickness of the section(s) of photoresist material on the substrate are approximately the same thickness. Temporary adhesives can be applied to the side of the handling substrate on which the photoresist material is coated to temporarily affix a semiconductor on insulator wafer device, for example, a silicon on insulator (SOI) wafer device, with the side of the semiconductor on insulator wafer device including a circuit pattern facing the handling substrate. For example and preferably, the semiconductor wafer thereof can be bonded to the side of the handling substrate coated with the temporary adhesive and photoresist section(s) in which preferably, the temporary adhesive may be substantially located in sections of the handling substrate that are exposed without photoresist material. The semiconductor on insulator wafer may substantially abut the section(s) of photoresist material. The side of the semiconductor on insulator wafer with the semiconductor wafer facing the handling substrate, preferably, can be in contact with sections of temporary adhesive positioned on the handling substrate at a thickness of approximately the thickness of the photoresist material section(s) such that the photoresist material sections can be used to maintain a desired distance and/or thickness of temporary adhesive between the handling substrate and the silicon wafer.

The insulator layer of the semiconductor on insulator wafer device, for example, an SOI device, can then be etched to remove a portion of that layer after which the etched semiconductor on insulator wafer device, for example, an SOI device can be separated from the handling substrate by, for example, dissolving the temporary adhesive using, for example, a solvent. The photoresist material section(s) can prevent adhesion of the semiconductor wafer to the handling substrate upon dissolution of the temporary adhesive in a solvent. Thereby, the capillary pressure on the silicon wafer can be reduced by an amount approximately proportional to the surface tension of the solvent and inversely proportional to the distance between the handling substrate and semiconductor wafer or thickness of the photoresist material section(s) positioned in between.

A portion of the insulator layer may need to be removed so as to avoid deleterious effects on the semiconductor on insulator wafer device. For example, an SOI wafer device such as, a detector, a portion of the insulator layer may need to be removed because that portion if not removed may add heat capacity that could slow down the detector's response. Also, there could be added intrinsic stress on the semiconductor or SOI wafer device caused by portions of the insulator layer, for example, an oxide layer which may be part of the insulator layer.

The semiconductor on insulator wafer device can include semiconductor wafer material on which a circuit pattern may be etched including, for example, silicon wafers, sapphire, or silicon nitride. The insulator section of the semiconductor on insulator wafer device can include one or multiple layers that act as a frame or support material and are affixed to the semiconductor material on which a circuit pattern is formed. The insulator section can also include a buried oxide layer that can serve as a bonding layer of the semiconductor on insulator device layer to the handle or frame material layer. Other embodiments of bonding layers can include, for example, amorphous silicon and polycrystalline silicon. An oxide is the preferred bonding layer. The frame material can include silicon, sapphire, or aluminum nitride.

The handling substrate may include, for example, an aluminum coated sapphire substrate, an aluminum coated silicon substrate, a silicon substrate, or an aluminum coated borosilicate glass (e.g., PYREX®) substrate. The photoresist may include, for example, SU-8, RISTON™, or any other negative resist which is insoluble in acetone, water, methanol, or other similar solvents that may be used to dissolve the temporary adhesive. The thickness of the photoresist can be based on the size of the membrane structure and range from about 5 microns to about 100 microns, preferably range from about 15 microns to about 30 microns. The temporary adhesive is an adhesive that will dissolve in the solvent used to remove it and won't outgas and may include, for example, CRYSTALBOND™ 509, CRYSTALBOND™ 590, and BGL™-7120.

The solvent used to dissolve the temporary adhesive is preferably a polar solvent, such as, for example, acetone or dodecanol or an aliphatic alcohol, for example ethanol, methanol, or isopropanol. More than one application of solvent can be used during the step of dissolving the temporary adhesive and more than one solvent can be used during this step as well.

Furthermore, the capillary pressure can be reduced even further in other embodiments by substituting a solvent, after it has dissolved the temporary adhesive, with a supercritical fluid (which can be achieved in a critical point dryer), through, for example, a series of dilutions of the solvent by the supercritical fluid. By reducing the capillary pressure, one can release the semiconductor wafer of the semiconductor on insulator device wafer, for example, a silicon wafer from the handling substrate while minimizing the risk of wafer breakage. The supercritical fluid may include, for example, liquid $CO_2$, liquid $CH_4$, and liquid $C_2H_6$. Use of a supercritical fluid is then removed in a critical point dryer.

Figure 2:
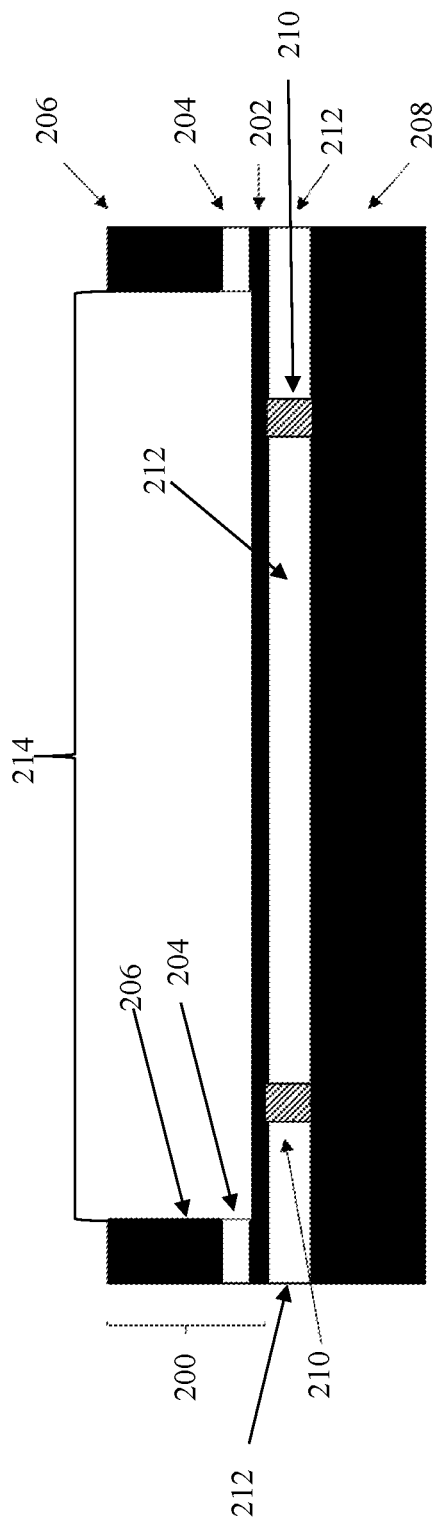
FIG. 2 is a schematic illustration of a cross section of an embodiment of the present disclosure.

FIG. 2 is a cross-section of one embodiment of the present disclosure including a wafer assembly having a micromachined device 200 having a silicon device layer/membrane 202 that includes a circuit pattern thereon, a buried oxide layer 204 and a silicon frame region 206. The buried oxide layer 204 and silicon frame region 206 make up the insulator layer of this embodiment. FIG. 2 also includes a handling substrate 208, for example, an aluminum coated sapphire substrate, with photoresist sections, for example, photoresist rail sections 210, for example SU-8 photoresist rail sections and a temporary bonding layer 212, the latter being a layer of temporary adhesive. The SU-8 rail sections can prevent adhesion of the membrane 202 to the handling substrate 208 upon dissolution of the temporary adhesive or bonding layer 212 in a solvent and, thereby, reduce the capillary pressure on the silicon device layer/membrane 202 by an amount approximately proportional to the inverse thickness of the photoresist rail sections 210. As noted above, the capillary pressure can be reduced even further by substituting the solvent used to dissolve the temporary bonding layer 212 with a supercritical fluid (which can be achieved in a critical point dryer). By reducing the capillary pressure, one can release the micromachined device 200 from the handling substrate 208 while minimizing the risk of membrane breakage compared to current methods and materials.

Upon dissolution of the temporary bonding layer 212 in a solvent, SU-8 rail sections 210 can reduce the effect of surface the silicon device layer/membrane 202 and the handling substrate 208. Therefore, separation of the micromachined device 200 from the handling substrate can result in less membrane breakage because of a reduction in the capillary pressure between the two.

Figure 3:
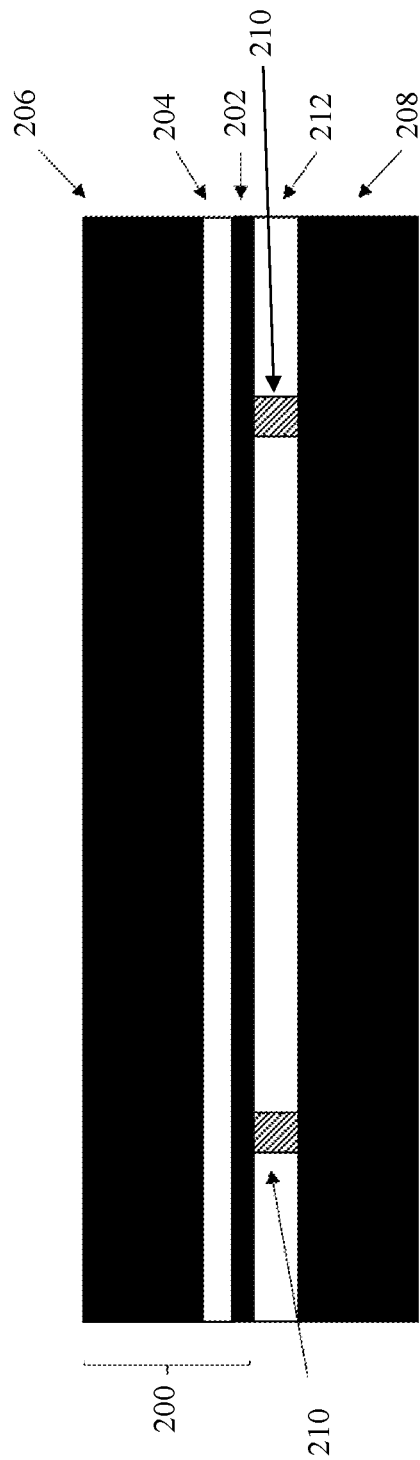
FIGS. 3-5 are schematic illustrations of other embodiments of the present disclosure.
Figure 4:
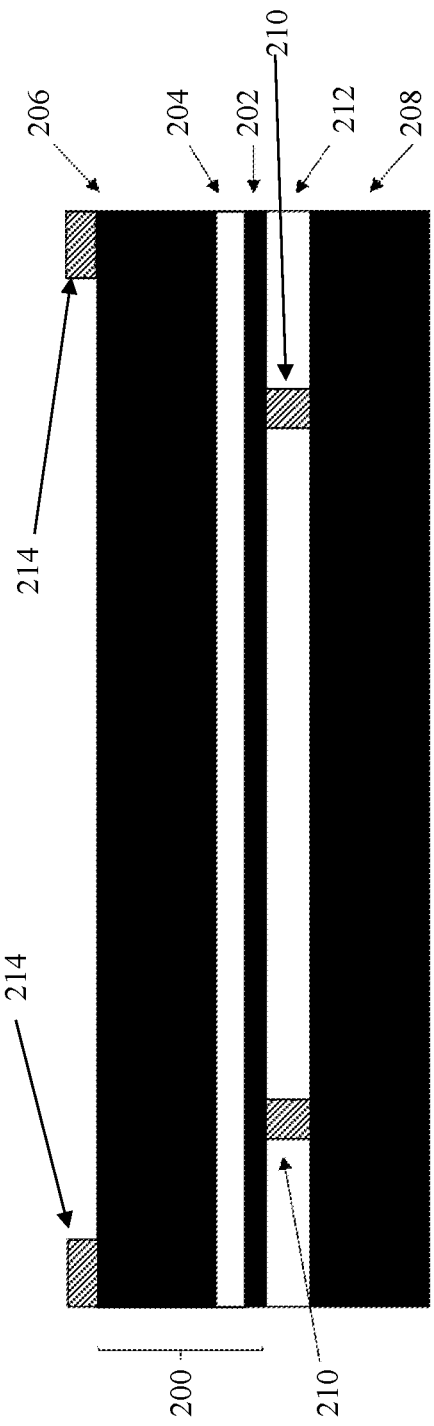
Figure 5:
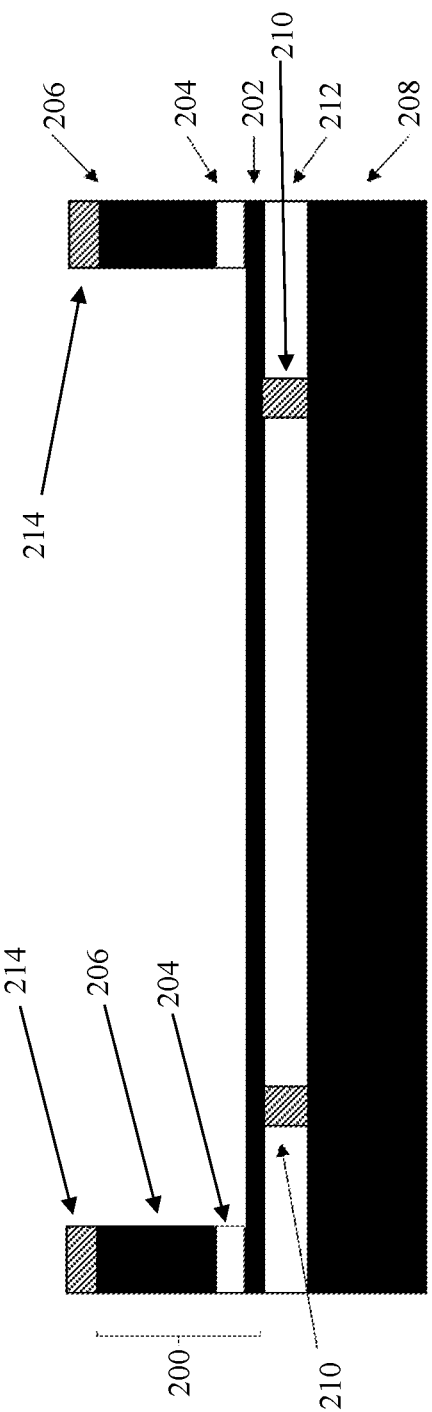

In one embodiment, a summary of the process steps illustrated in FIGS. 3-5 may include: (1) application of and patterning photoresist material onto the side of a handling substrate with a laminated film; (2) etching of the laminated film (3) application of a temporary adhesive to the patterned photoresist material coated side of the handling substrate; (4) wafer-scale bonding of the patterned photoresist material coated handling substrate to a semiconductor on insulator handle wafer substrate (in which the semiconductor wafer of the semiconductor on insulator wafer device layer has been patterned and etched with a circuit and the patterned and etched side of the semiconductor on insulator faces the patterned photoresist material coated handling substrate) as illustrated in FIG. 3; (5) patterning of the insulator handle wafer of the semiconductor on insulator wafer device (in one embodiment, the pattern as shown for example in the "Mask Layout" of FIG. 6) using photoresist material 214 as illustrated in FIG. 4; (6) Etching the insulator handle wafer down through the insulator layer as illustrated in FIG. 5; and (7) immersing the semiconductor on insulator wafer device and the patterned photoresist material coated sapphire substrate in solvent to dissolve the temporary adhesive. At some point during the process after step (6), the photoresist material 214 from the embodiment illustrated in FIG. 5 is removed thereby resulting in the embodiment illustrated in FIG. 2.

Other embodiments may also include the following steps to the process in the previous paragraph including (8) diluting the adhesive concentration in the solvent and replacing the solvent with increasingly at least one more non-polar solvent, or, for example, a supercritical fluid, such as for example, liquid $CO_2$. That can be followed by (9) critical point drying the more non-polar solvent in a critical point dryer, such as a Tousimis Autosamdri®-931.

Figure 6:
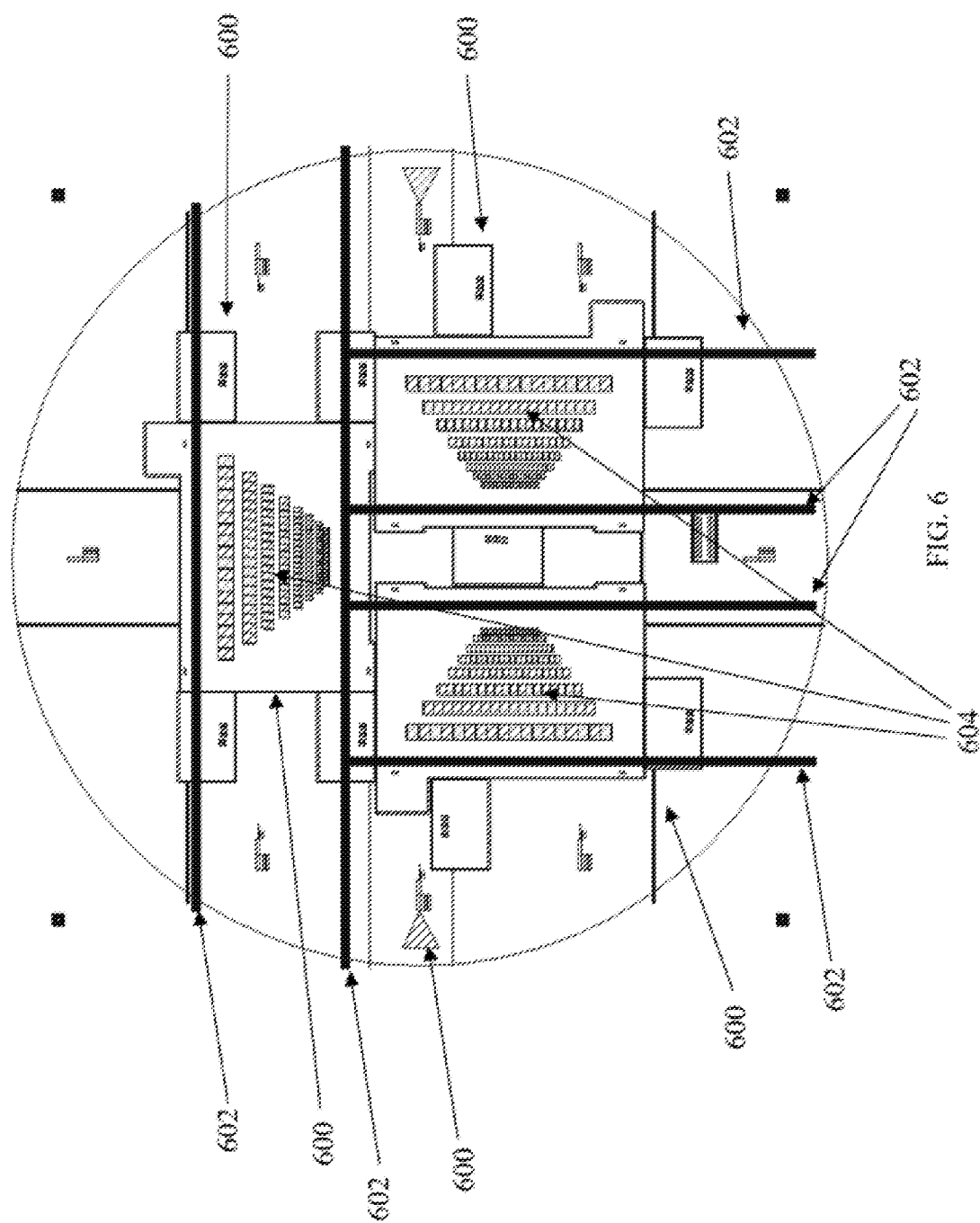
FIG. 6 is a schematic illustration of a plan view of an embodiment of the present disclosure including a circuit pattern and a photoresist pattern.

FIG. 6 illustrates the circuit patterning 600 of semiconductor on insulator, for example, an SOI on the side of the wafer facing the viewer and the photoresist rail pattern 602 in the cross-hatched area shown on the opposite side to the viewer. Sections 604 are deep etched regions where the membranes will be fabricated.

Figure 7:
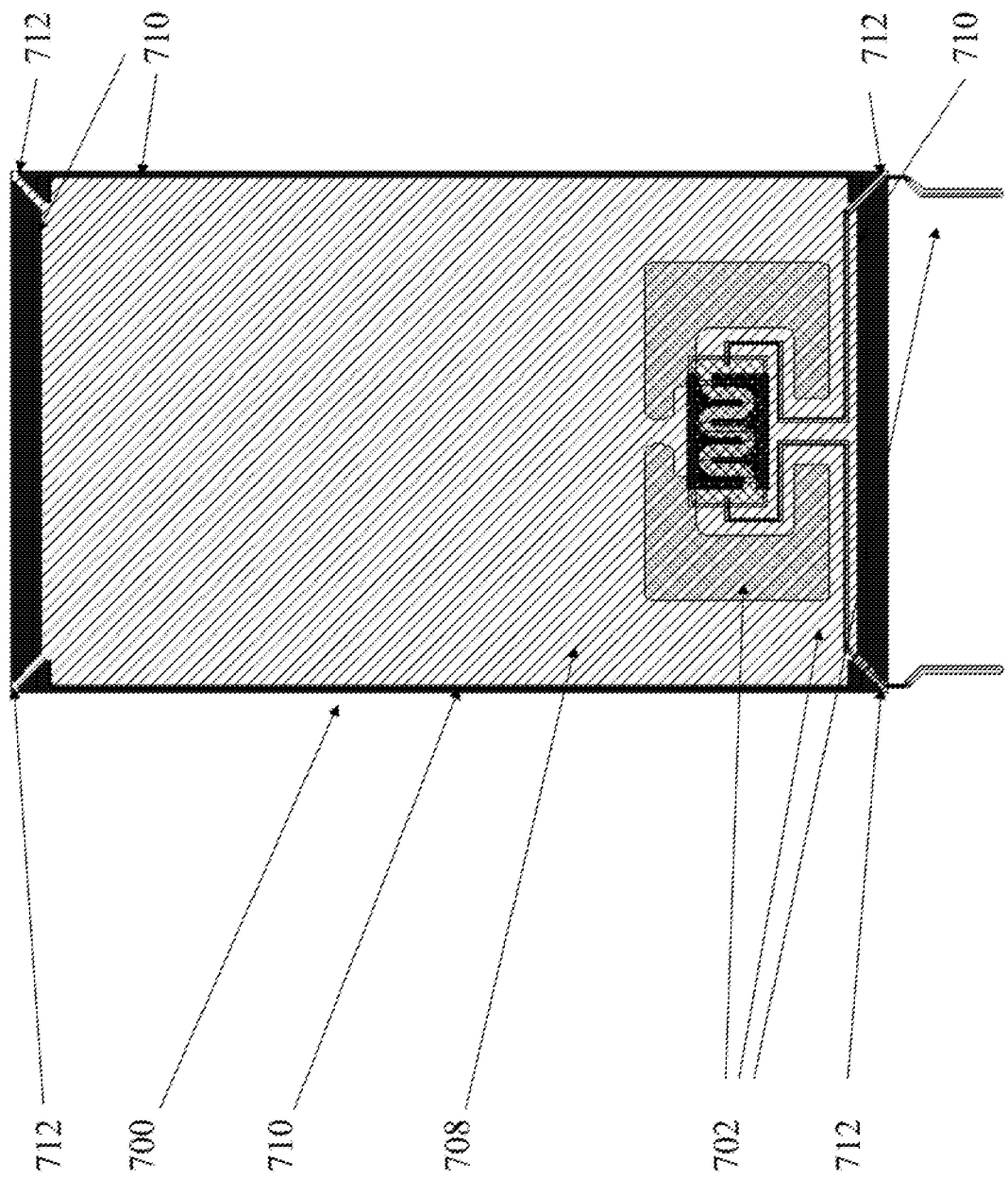
FIG. 7 is a schematic illustration of a plan view of an embodiment of the present disclosure including the bolometric detector circuit elements and silicon membrane.

FIG. 7 illustrates an embodiment of a bolometric detector on a semiconductor on insulator device 700 and with the circuit pattern 702 on a thin semiconductor membrane hatched area 708. The insulator material is etched on the backside of the device 700 and includes etched sections of the semiconductor membrane 710, legs 712 located at the corners thereof and the hatched area 708.

In another embodiment, a summary of the process steps to form the embodiment of FIG. 2 may include: (1) application of and patterning (in one embodiment the pattern is shown in the "Mask Layout" attachment) of SU-8 photoresist on an aluminum coated sapphire substrate; (2) etching of the aluminum thin film; (3) application of a temporary adhesive to the SU-8-coated sapphire substrate; (4) wafer-scale bonding of the SU-8 coated sapphire substrate to a silicon on insulator wafer substrate (in which the silicon on insulator wafer device layer has been patterned and etched. In one embodiment, the pattern is shown in "Mask Layout"); (5) patterning of the silicon on insulator handle wafer (in one embodiment, the pattern as shown for example in the "Mask Layout" of FIG. 6); (6) etching the silicon on insulator handle wafer down to the buried oxide layer; (7) etching the buried oxide layer; (8) immersing the wafer in acetone to dissolve the temporary adhesive; (9) Diluting the adhesive concentration in the acetone and replacing the acetone with increasingly more non-polar solvents; (10) Critical point drying the more non-polar solvent; in one embodiment, the solvent consists of isopropanol.

Alternative embodiments of the innovation would include the use of a different membrane substrate material. For instance, silicon nitride could be used. In this embodiment, a silicon nitride layer would be coated on top of a silicon wafer with a silicon dioxide coating.

Example 1

1. Su-8 Rails

Electron-beam deposit 20 nanometers of Al on a sapphire wafer.

Spin on a layer of hexamethyldisilazane (HMDS) on Al-coated side of wafer and soft bake on a hot plate at a temperature ranging between 90 and 120 degrees Centigrade.

Spin on a layer of SU-8 2010 photoresist on Al-coated side of wafer such that its thickness ranges between 18 and 22 microns. Soft bake wafer on a hot plate at a temperature ranging between 60 and 100 degrees Celsius.

After wafer has cooled to ambient, expose photoresist using a contact aligner or stepper.

Perform a post-exposure bake of wafer on a hot plate at a temperature ranging between 60 and 100 degrees Celsius.

Develop SU-8 in SU-8 developer (n-pentanone) and rinse developer with isopropanol.

Hard bake SU-8 in oven at a temperature ranging between 150 and 200 degrees Celsius.

Oxygen plasma ash wafer.

Etch Al in a reactive ion etcher using a mixture of Cl, $BCl_3$, and Ar.

Rinse wafer with isopropanol and dry with nitrogen.

2. Wax Bonding

Place SU-8 rail-coated sapphire wafer on a hot plate set to a temperature ranging between 120 and 140 degrees Celsius and apply Crystalbond-509 wax.

Degas wax in vacuum oven set to a temperature ranging between 110 and 130 degrees Celsius.

Once sapphire wafer has cooled to ambient temperature, place the silicon device layer on the silicon on insulator wafer in contact with the wax-coated side of the sapphire wafer. Pre-bond this wafer sandwich on a hot plate set to a temperature ranging between 120 and 140 degrees Celsius to melt wax.

Bond wafer sandwich with a wafer bonder set to a temperature ranging between 120 and 130 degrees Celsius and pressure set to between 1.25 and 2.0 bar for a 4" wafer.

Clean excess wax with solvents.

4. Back Etch Trenches

MASK: Backetch-HIGH RES—Marks 6, 7, 8, 9, 12, 16

Oxygen plasma ash handle layer of silicon on insulator wafer.

Spin on a layer of hexamethyldisilazane (HMDS) on the handle layer of the silicon on insulator wafer and soft bake on a hot plate at a temperature ranging between 90 and 120 degrees Centigrade.

Spin on a layer of positive photoresist on the handle layer of the silicon on insulator wafer such that its thickness ranges between 10 and 15 microns. Soft bake wafer on a hot plate at a temperature ranging between 90 and 120 degrees Celsius.

Expose photoresist using a contact aligner or stepper.

Develop photoresist in potassium hydroxide-based developer and rinse with deionized water.

Deep reactive ion etch the handle layer of the silicon on insulator wafer using the Bosch process until the silicon on insulator buried oxide layer is reached.

5. Wet Etch Steps

Etch the silicon on insulator buried oxide layer in dilute hydrofluoric acid. Rinse in deionized water.

6. Chip Release

Place wafer inside a critical point dryer carrier in an acetone-filled bucket to dissolve Crystalbond-509 wax.

Once wax is fully dissolved, suction out the acetone and replace it with isopropanol.

Fill cavity in critical point dryer with isopropanol and place critical point dryer carrier, which contains the wafer, inside cavity.

Start critical point dryer process.

After critical point drying process is complete, remove parts from carrier.

This written description uses examples as part of the disclosure, including the best mode, and also to enable any person skilled in the art to practice the disclosed implementations, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A bolometric detector semiconductor processing laminate construct, comprising:
   a handling substrate including a photoresist material on a first surface thereof;
   a semiconductor wafer having a circuit pattern on a first surface and a second surface to be processed; and
   a temporary adhesive layer temporarily bonding the first surface of the semiconductor wafer to the first surface of the handling substrate including the photoresist material; wherein the semiconductor processing laminate construct includes the handling substrate including the photoresist material on the first surface thereof, a semiconductor on insulator wafer device and the temporary adhesive layer with the semiconductor on insulator wafer device includes the semiconductor wafer having said circuit pattern on the first surface and the second surface and insulator material to be processed on the second surface of the semiconductor wafer; a wafer assembly micromachined with a silicon device layer that includes the circuit pattern thereon, a buried oxide layer and a silicon frame region whereby the buried oxide layer and silicon frame region make up an insulator layer whereby the temporary adhesive layer temporarily bonds the first surface of the semiconductor wafer to the first surface of the handling substrate thus reducing capillary pressure on a silicon wafer by an amount approximately proportional to an existing solvent surface tension and inversely proportional to a distance between the handling substrate and thickness of a photoresist material section positioned in between the handling substrate and the semiconductor wafer;
   means for applying and patterning photoresist material onto a side of the handling substrate with a laminated film; means for etching of the laminated film, application of a temporary adhesive to the patterned photoresist material; and
   means for wafer-scale bonding of the patterned photoresist material coated handling substrate to a semiconductor on insulator handle wafer substrate.

2. The semiconductor processing laminate construct of claim 1, wherein the handling substrate includes a section of the photoresist material and a section of exposed substrate of the first surface thereof.

3. The semiconductor processing laminate construct of claim 2, wherein the temporary adhesive is positioned in contact with the section of exposed substrate.

4. The semiconductor processing laminate construct of claim 1, wherein the photoresist material is positioned between the first surface of the handling substrate and the first surface of the semiconductor wafer.

5. The semiconductor processing laminate construct of claim 1, wherein the handling substrate includes a section of the photoresist material and a section of exposed substrate of the first surface thereof, the temporary adhesive is positioned in contact with the section of exposed substrate and the photoresist material is positioned between the first surface of the handling substrate and the first surface of the semiconductor wafer.

6. The semiconductor processing laminate construct of claim 1, wherein the handling substrate includes a plurality of sections of the photoresist material and the sections of photoresist material are of substantially uniform thickness relative to the first surface of the handling substrate.

7. The semiconductor processing laminate construct of claim 1, wherein the handling substrate is an aluminum coated sapphire substrate.

8. The semiconductor processing laminate construct of claim 1, wherein the photoresist material is SU-8.

* * * * *